(12) United States Patent
Hishinuma et al.

(10) Patent No.: US 8,176,365 B2
(45) Date of Patent: May 8, 2012

(54) COMPUTER APPARATUS AND PROCESSOR DIAGNOSTIC METHOD

(75) Inventors: Takeo Hishinuma, Kawasaki (JP);
Yoshinori Mesaki, Kawasaki (JP);
Osamu Ishibashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 12/533,064

(22) Filed: Jul. 31, 2009

(65) Prior Publication Data
US 2010/0088545 A1   Apr. 8, 2010

(30) Foreign Application Priority Data
Oct. 3, 2008   (JP) .................................. 2008-258976

(51) Int. Cl.
*G06F 11/00* (2006.01)
(52) U.S. Cl. .......................................... 714/31; 714/36
(58) Field of Classification Search ............... 714/31, 714/36
See application file for complete search history.

(56) References Cited

U.S. PATENT DOCUMENTS

| | | | |
|---|---|---|---|
| 5,539,878 A | 7/1996 | Kikinis | |
| 5,987,625 A * | 11/1999 | Wolff | 714/36 |
| 6,408,412 B1 * | 6/2002 | Rajsuman | 714/724 |
| 6,654,707 B2 * | 11/2003 | Wynn et al. | 702/186 |
| 6,654,905 B1 * | 11/2003 | Dickens | 714/10 |
| 7,155,351 B2 * | 12/2006 | Mattern et al. | 702/58 |
| 7,478,281 B2 * | 1/2009 | Denniston | 714/31 |
| 7,890,828 B2 * | 2/2011 | Taylor et al. | 714/733 |
| 2002/0129298 A1 | 9/2002 | Tamura | |
| 2003/0056163 A1 * | 3/2003 | Rajsuman et al. | 714/724 |
| 2003/0065986 A1 * | 4/2003 | Fraenkel et al. | 714/47 |
| 2004/0255197 A1 * | 12/2004 | Schelling | 714/36 |
| 2005/0114743 A1 * | 5/2005 | Moorhouse | 714/100 |
| 2007/0245170 A1 * | 10/2007 | Crowell et al. | 714/36 |

FOREIGN PATENT DOCUMENTS

| | | |
|---|---|---|
| EP | 0 442 651 A2 | 8/1991 |
| JP | 06-004413 A | 1/1994 |
| JP | 7-191856 | 7/1995 |

OTHER PUBLICATIONS

Extended European Search Report mailed Mar. 5, 2012, for corresponding European Application No. EP 09166982.

* cited by examiner

*Primary Examiner* — Marc Duncan
(74) *Attorney, Agent, or Firm* — Fujitsu Patent Center

(57) ABSTRACT

A computer apparatus includes a first processor, a second processor, and a main memory. The computer apparatus further includes a memory-diagnostic unit, a diagnostic-program loading unit, and a defective-function identifying unit. The memory-diagnostic unit causes the second processor to execute a memory-diagnostic program to diagnose the main memory, and identifies a defective area in the main memory. The diagnostic-program loading unit loads a processor-diagnostic program for diagnosing a plurality of functions of the first processor into an area of the main memory other than the defective area identified by the memory-diagnostic unit. The defective-function identifying unit causes the second processor to execute the processor-diagnostic program loaded by the diagnostic-program loading unit, and identifies a defective function that is disabled from the functions of the first processor.

6 Claims, 4 Drawing Sheets

| (1) | (2) | (3) | (4) |
|---|---|---|---|
| (5) | (6) | (7) | (8) |
| (9) | (10) | (11) | (12) |
| (13) | (14) | (15) | (16) |
| (17) | (18) | (19) | (20) |

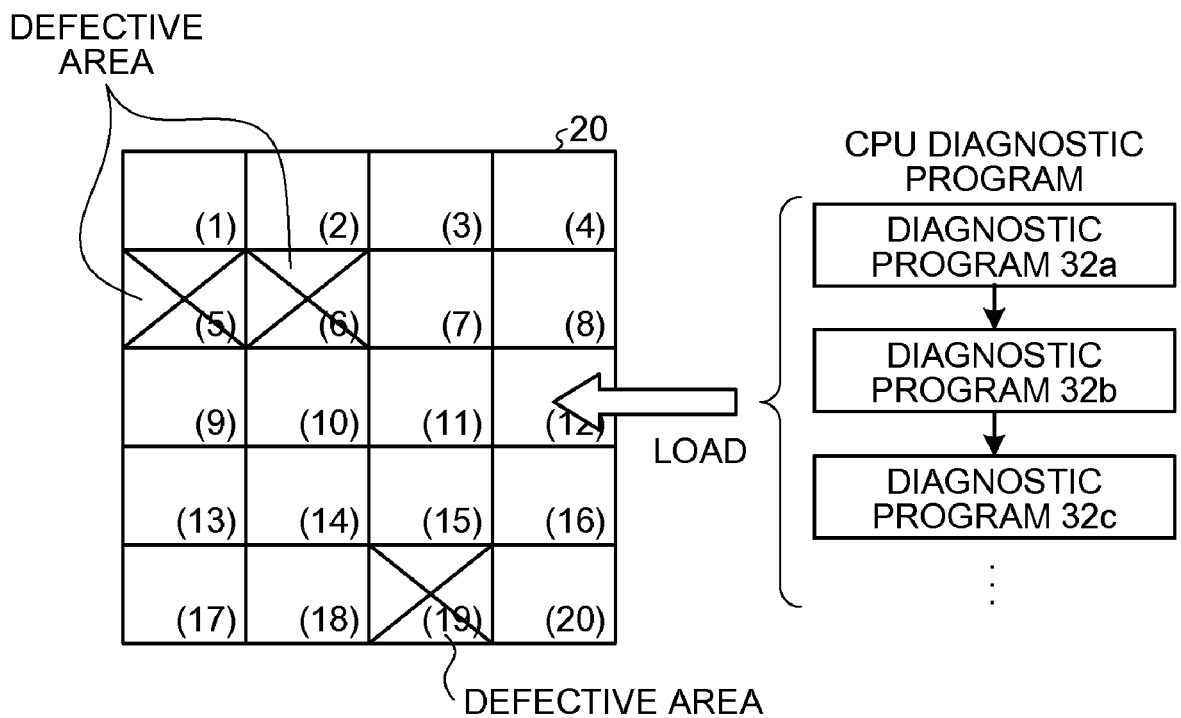

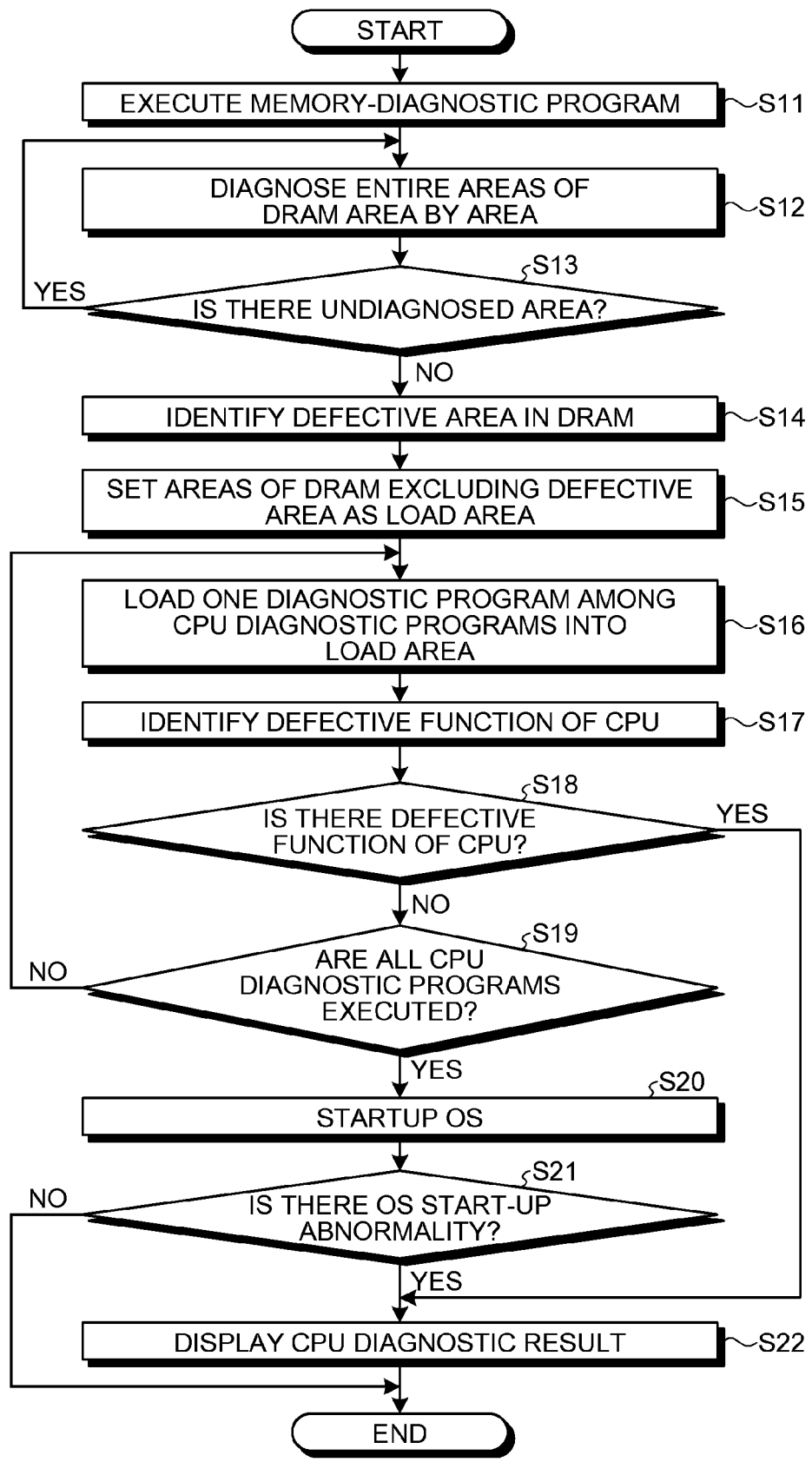

COMPUTER APPARATUS AND PROCESSOR DIAGNOSTIC METHOD

CROSS-REFERENCE TO RELATED APPLICATION

This application is based upon and claims the benefit of priority of the prior Japanese Patent Application No. 2008-258976, filed on Oct. 3, 2008, the entire contents of which are incorporated herein by reference.

FIELD

The embodiment discussed herein is directed to a computer apparatus and a processor diagnostic method.

BACKGROUND

Various types of diagnostic tests have been conducted to diagnose defective portions of each device built in the computer apparatus. For example, Japanese Laid-open Patent Publication No. H06-4413 discloses a memory-diagnostic test that diagnoses whether the memory-function of each of built-in memories correctly functions (for example, whether predetermined data can be properly read from or written to memory).

In this type of computer apparatus, a diagnostic program corresponding to each device is stored in part of an internal read only memory (ROM). After an operation system (OS) is started up, a processor such as a central processing unit (CPU) loads the diagnostic program into a main memory such as a random access memory (RAM) and executes it to conduct various diagnostic tests.

However, in the conventional computer apparatus described above, when there is an abnormality in the processor, the diagnostic tests cannot be properly conducted. Specifically, the processor performs a plurality of functions, and accordingly, if there is a defective function which cannot be performed in the functions, the operation of the processor becomes unstable. Therefore, the diagnostic programs cannot be properly executed.

SUMMARY

According to an aspect of an embodiment, a computer apparatus includes a first processor, a second processor, and a main memory. The computer apparatus further includes a memory-diagnostic unit, a diagnostic-program loading unit, and a defective-function identifying unit. The memory-diagnostic unit causes the second processor to execute a memory-diagnostic program to diagnose the main memory, and identifies a defective area in the main memory. The diagnostic-program loading unit loads a processor-diagnostic program for diagnosing a plurality of functions of the first processor into an area of the main memory other than the defective area identified by the memory-diagnostic unit. The defective-function identifying unit causes the second processor to execute the processor-diagnostic program loaded by the diagnostic-program loading unit, and identifies a defective function that is disabled from the functions of the first processor.

According to another aspect of an embodiment, a processor diagnostic method applied to a computer apparatus provided with a first processor, a second processor, and a main memory, including: a memory-diagnostic unit causing the second processor to execute a memory-diagnostic program to diagnose the main memory, and identifying a defective area in the main memory; a diagnostic-program loading unit loading a processor-diagnostic program for diagnosing a plurality of functions of the first processor into an area of the main memory other than the defective area identified by the memory-diagnostic unit; and a defective-function identifying unit causing the second processor to execute the processor-diagnostic program loaded by the diagnostic-program loading unit, and identifying a defective function that is disabled from the functions of the first processor.

According to still another aspect of an embodiment, a computer readable storage medium stores instructions that, when executed, causes a computer to implement the above method.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 is an example of a CPU-diagnostic program;

FIG. 5 is an example schematic diagram for explaining a CPU-diagnostic process; and FIG. 6 is an example flowchart of the CPU-diagnostic process performed by the computer apparatus according to the embodiment.

DESCRIPTION OF EMBODIMENTS

Figure 1:
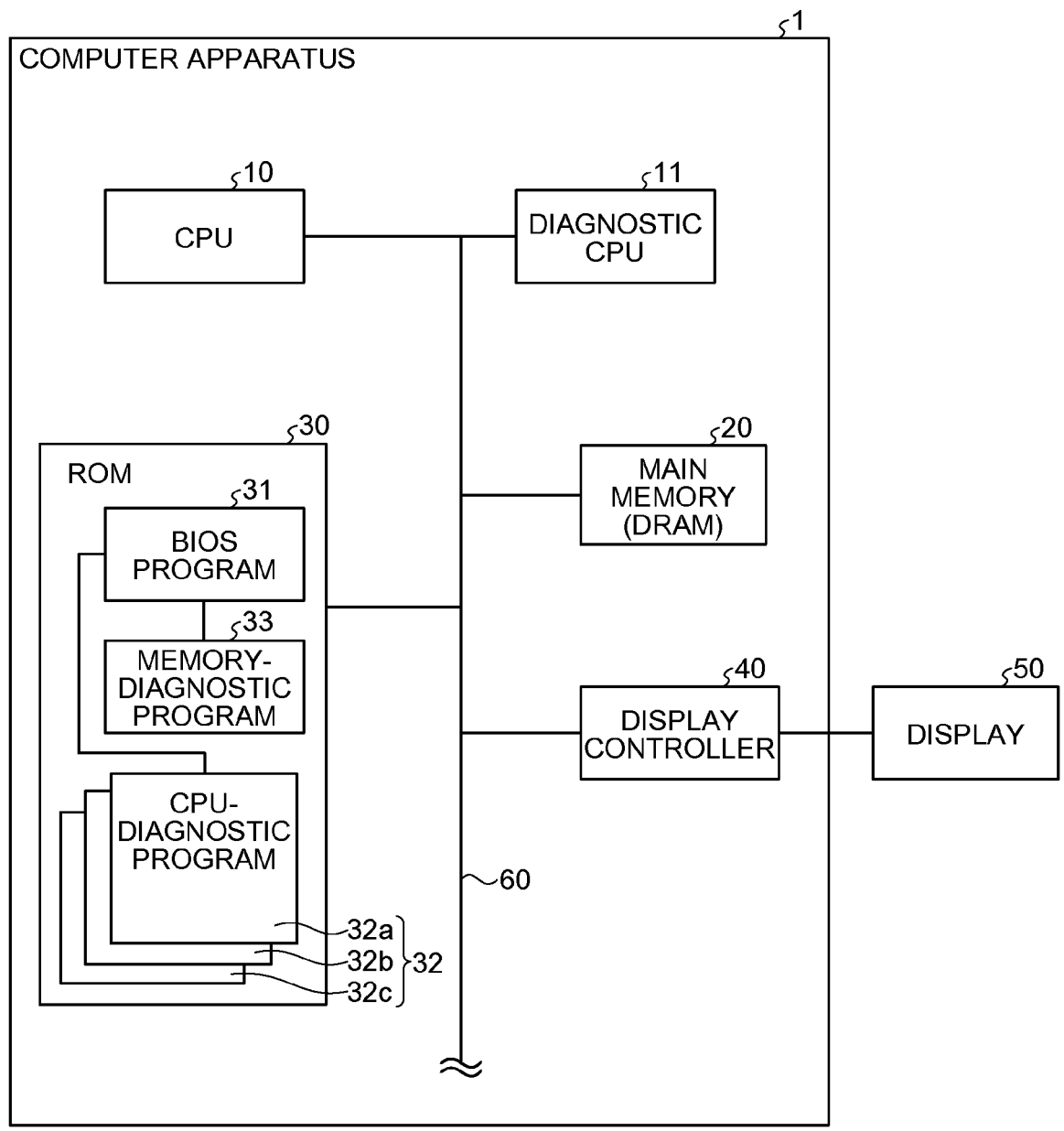
FIG. 1 is an example functional block diagram of a computer apparatus according to an embodiment.

Exemplary embodiments of the invention will be explained with reference to the accompanying drawings.

First, outline of a computer apparatus according to an embodiment is explained. The computer apparatus according to the embodiment includes a first processor, a second processor, and a main memory. The computer apparatus further includes a memory-diagnostic unit, a diagnostic-program loading unit, and a defective-function identifying unit. The memory-diagnostic unit causes the second processor to execute a memory-diagnostic program to diagnose the main memory, and identifies a defective area in the main memory. Into the area of the main memory other than the defective area, the diagnostic-program loading unit loads a processor-diagnostic program for diagnosing a plurality of functions of the first processor. The defective-function identifying unit causes the second processor to execute the loaded processor-diagnostic program, and identifies a defective function that is disabled, i.e., that cannot be performed, among the functions of the first processor.

The computer apparatus according to the embodiment includes two processors, the first processor and the second processor, such as CPU. The second processor executes the processor-diagnostic program capable of diagnosing the functions of the first processor on the main memory, and diagnoses the first processor. The first processor has not only basic functions such as calculation function and data input/output function, but also has the applicable functions such as virtual-address-conversion function of the main memory.

In the process of diagnosing the first processor, the memory-diagnostic unit diagnoses the main memory in the computer apparatus, and identifies a defective area in the main memory. The term "defective area" as used herein refers to an area in which memory function such as read/write function does not function properly in the entire area of the main memory.

The diagnostic-program loading unit loads the processor-diagnostic program into the area of the main memory other than the defective area. In other words, the processor-diagnostic program is always loaded in an area of the main memory where the memory function properly functions. Therefore, a situation where the processor-diagnostic program is unexecutable can be reliably avoided.

The processor-diagnostic program includes a plurality of diagnostic programs that diagnoses the functions of the first processor, respectively. The diagnostic-program loading unit sequentially loads the diagnostic programs in a predetermined order. As the predetermined order, an order which is predetermined for each of the functions of the first processor can be adopted. For example, an order from basic functions such as calculation function and data input/output function for various devices to other applicable functions can be adopted.

The defective-function identifying unit sequentially executes the sequentially loaded diagnostic programs, and then gradually identifies a defective function, which cannot be performed or is disabled, among the functions of the first processor. Therefore, the processing load of the second processor can be reduced compared to the case where the second processor executes one processor-diagnostic program at a time.

Thus, according to the embodiment, by diagnosing the main memory when the second processor diagnoses the first processor, a defective area in the main memory is identified. Then, the processor-diagnostic program is loaded into the main memory excluding the defective area. By executing the loaded processor-diagnostic program, a defective function, which cannot be performed or is disabled, is identified among the functions of the first processor. With this, the defective function of the processor can be reliably identified, and proper conduction of various diagnostic tests can be ensured.

For example, a BIOS program and the like may be read from a ROM when the computer apparatus is started up and executed by the second processor to realize the same functions as the memory-diagnostic unit, diagnostic-program loading unit, and the defective-function identifying unit.

Figures 2, 3:
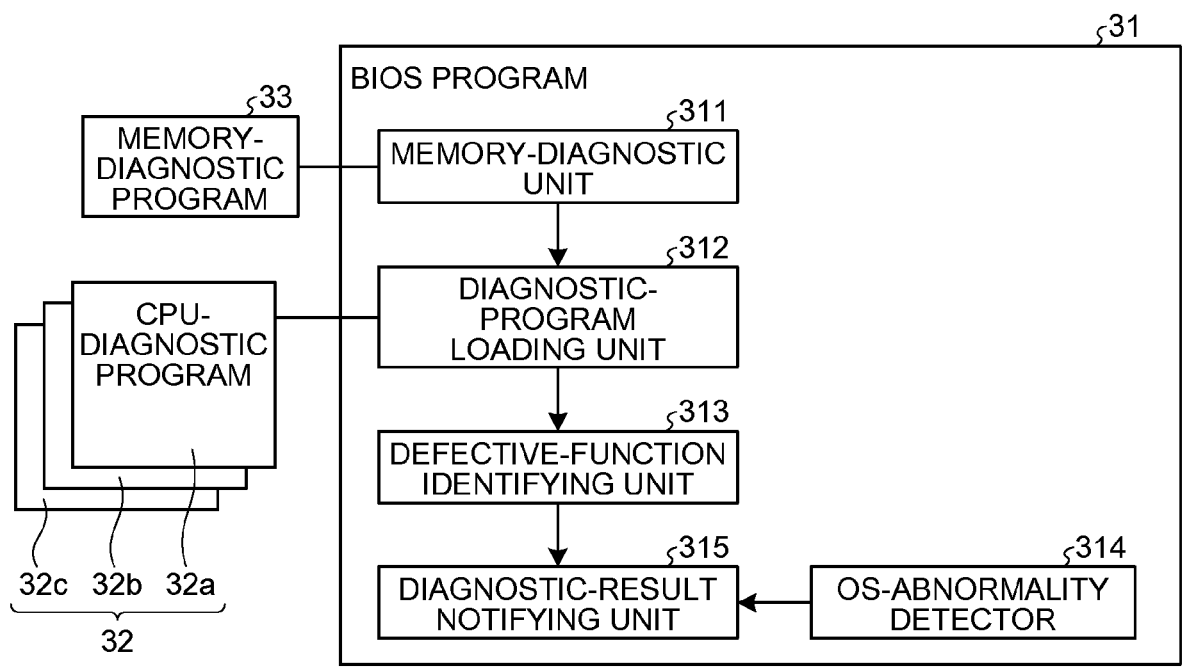
FIG. 2 is an example schematic diagram for explaining DRAM illustrated in FIG. 1 in detail.
FIG. 3 is an example functional block diagram of a BIOS program illustrated in FIG. 1.

Referring to FIG. 1, a configuration of a computer apparatus 1 according to an embodiment is explained. FIG. 1 is a functional block diagram of the computer apparatus 1 according to the embodiment. FIG. 2 is a diagram for explaining DRAM illustrated in FIG. 1 in detail.

As illustrated in FIG. 1, the computer apparatus 1 includes a CPU 10, a diagnostic CPU 11, a DRAM 20, a ROM 30, and a display controller 40, which are connected one another by a bus 60.

The CPU 10, as the first processor, is a controller that controls the overall operation of the computer apparatus 1 and performs various functions.

The diagnostic CPU 11, as the second processor, is a self-diagnostic controller that reads a basic input-output system (BIOS) program 31 from the ROM 30 when the computer apparatus 1 is started up, and executes the BIOS program 31 to diagnose the CPU 10. Specifically, while executing the BIOS program 31, the diagnostic CPU 11 reads a CPU-diagnostic program 32 from the ROM 30, and executes the CPU-diagnostic program 32 on the DRAM 20 to diagnose the CPU 10.

The DRAM 20 is the main memory of the computer apparatus 1. Specifically, the DRAM 20 is used as a working memory into which a program to be executed by the CPU 10, such as the BIOS program 31 and the CPU-diagnostic program 32, is loaded, and temporarily stores various data regarding the program and the like. As illustrated in FIG. 2, to be used as the working memory of the CPU 10, the DRAM 20 is divided into a plurality of areas (1) to (20) in a predetermined size, and is controlled.

The ROM 30 stores data and various programs executed by the CPU 10. The ROM 30 stores programs including the BIOS program 31, the CPU-diagnostic program 32, and a memory-diagnostic program 33.

The BIOS program 31 is a basic input/output program. Specifically, the BIOS program 31 starts up when the computer apparatus 1 is turned on. The BIOS program 31 is a control program that controls input/output of data between the OS or an application program and the DRAM 20 or a peripheral apparatus (such as display and keyboard). The BIOS program 31 is executed by the diagnostic CPU 11 and conducts a CPU-diagnostic process (processor-diagnostic process) to diagnose whether a plurality of functions of the CPU 10, such as calculation function, are normally performed. A concrete configuration, in which the BIOS program 31 performs the CPU-diagnostic process, is separately explained in detail.

The CPU-diagnostic program 32 is a processor-diagnostic program capable of diagnosing the functions of the CPU 10. The CPU-diagnostic program 32 is executed when the BIOS program 31 performs the CPU-diagnostic process for the CPU 10. In the embodiment, the CPU-diagnostic program 32 includes a plurality of diagnostic programs 32a, 32b, 32c, . . . , which diagnose the functions of the CPU 10, respectively.

For example, as illustrated in FIG. 4, the diagnostic program 32a diagnoses whether the calculation function of the CPU 10 is normally operable. The diagnostic program 32b also diagnoses whether the data input/output function of the CPU 10 is normally operable. Further, the diagnostic program 32c diagnoses whether the virtual-address-conversion function of the CPU 10 is normally operable. FIG. 4 is illustrates an example of the CPU-diagnostic program 32.

The memory-diagnostic program 33 diagnoses whether various memory functions of the DRAM 20 normally function (for example, whether predetermined data can be normally written and read). As with the CPU-diagnostic program 32, the memory-diagnostic program 33 is executed when the BIOS program 31 performs the CPU-diagnostic process for the CPU 10.

The display controller 40 is connected to a display 50, and outputs display-output such as the diagnostic-result of the CPU 10 on the display 50. The display 50 is an image-display apparatus that visibly displays the display-output from the display controller 40.

Referring to FIG. 3, a concrete configuration in which the BIOS program 31 performs the CPU-diagnostic process for the CPU 10 is explained in detail. FIG. 3 is a detailed functional block diagram of the BIOS program 31. In FIG. 3, a function, which is realized when the BIOS program 31 stored in the ROM 30 is executed by the diagnostic CPU 11, is illustrated as a functional block.

As functional units, the BIOS program 31 includes a memory-diagnostic unit 311, a diagnostic-program loading unit 312, a defective-function identifying unit 313, an operating system (OS)-abnormality detector 314, and a diagnostic-result notifying unit 315. Each of the functional units 311 to 315 is placed in operation when the BIOS program 31 is started up (being executed).

As described above, the BIOS program 31 is first executed when the computer apparatus 1 is started up. The CPU-diagnostic process of the CPU 10 is performed before the OS is started up. Therefore, it is possible to normally execute the CPU-diagnostic program even when the OS does not start up.

The memory-diagnostic unit 311 diagnoses the DRAM 20 and identifies a defective area in the DRAM 20. The defective area indicates an area, among the entire area of the DRAM 20, in which memory functions such as read/write function do not function properly. The diagnosis of the DRAM 20 is conducted by executing the memory-diagnostic program 33.

The diagnostic-program loading unit 312 loads the CPU-diagnostic program 32 into the area of the DRAM 20 other than the defective area identified by the memory-diagnostic unit 311. The diagnostic-program loading unit 312 sequentially loads the diagnostic programs 32a, 32b, 32c, . . . , which are included in the CPU-diagnostic program 32, in a predetermined order.

As the predetermined order, the embodiment adopts the order from the basic functions to the applicable functions of the CPU 10. For example, as illustrated in FIG. 4, the calculation function that is the diagnostic function of the diagnostic program 32a is more basic than the data input/output function that is the diagnostic function of the diagnostic program 32b. Therefore, the diagnostic-program loading unit 312 loads the CPU-diagnostic program 32 in the order from the diagnostic program 32a to 32b. Further, the data input/output function that is the diagnostic function of the diagnostic programs 32b is more basic than the virtual-address-conversion function that is the diagnostic function of the diagnostic program 32c. Therefore, the diagnostic-program loading unit 312 loads the CPU-diagnostic program 32 in the order of the diagnostic programs 32a, 32b, and 32c.

The defective-function identifying unit 313 executes the CPU-diagnostic program 32 loaded by the diagnostic-program loading unit 312, and then identifies a defective function that cannot be performed from among the functions of the CPU 10. The defective-function identifying unit 313 sequentially executes the CPU-diagnostic program 32 including the diagnostic programs 32a, 32b, and 32c, . . . sequentially loaded in this order, and gradually identifies a defective function of the CPU 10. Therefore, it is possible to reduce the processing load of the diagnostic CPU 11 compared to the case where the diagnostic CPU 11 executes one CPU-diagnostic program 32 at with a time.

The OS-abnormality detector 314 detects start-up abnormality of the OS. The start-up abnormality of the OS includes a so-called hung-up, i.e., a state where the computer apparatus 1 stops and does not receive input from a keyboard or a mouse, and a blue screen or black screen, i.e., a state where the process of the OS itself becomes impossible to continue. For example, the OS-abnormality detector 314 measures a normal start-up time of the computer apparatus 1 in advance, determines a time-out period and stores the time-out period in a predetermined area of the ROM 30. Even after the time-out period elapses, if the OS is still in the states of hung-up, blue screen, or black screen, the OS-abnormality detector 314 detects the start-up abnormality of the OS.

When the OS-abnormality detector 314 detects the start-up abnormality of the OS, the diagnostic-result notifying unit 315 outputs the defective function identified by the defective-function identifying unit 313 to the display controller 40 as the diagnostic result of the CPU 10. The diagnostic result of the CPU 10 output to the display controller 40 is displayed on the display 50. Therefore, a user who checks the diagnostic result of the CPU 10 displayed on the display 50 can immediately take appropriate measures, such as repair of the defective part in the CPU 10 or replacement of the CPU 10.

Referring to FIG. 5, the CPU-diagnostic process for the CPU 10 performed by the BIOS program 31 is concretely explained. FIG. 5 is a diagram for explaining the CPU-diagnostic process for the CPU 10 performed by the BIOS program 31.

First, as illustrated in FIG. 5, when the memory-diagnostic program 33 is executed by the memory-diagnostic unit 311, a defective area in the DRAM 20 is identified. In FIG. 5, among the entire areas (1) to (20) of the DRAM 20, areas (5), (6), and (19) are identified as defective areas.

Subsequently, the diagnostic-program loading unit 312 sets the entire areas of the DRAM 20 other than the defective areas as load areas, into which the CPU-diagnostic program 32 is to be loaded. In FIG. 5, among the entire areas of the DRAM 20, areas excluding the areas (5), (6), and (19) are set as the load area of the CPU-diagnostic program 32. Accordingly, the CPU-diagnostic program 32 is always loaded into an area of the DRAM 20 where the memory function normally functions. Therefore, a situation where the CPU-diagnostic process is interrupted halfway through can be reliably avoided.

Then, by the diagnostic-program loading unit 312, the diagnostic programs 32a, 32b, 32c, . . . , included in the CPU-diagnostic program 32 are sequentially loaded in this order. Then, the diagnostic programs 32a, 32b, 32c, . . . , are sequentially executed by the defective-function identifying unit 313, and a defective function is gradually identified from the functions of the CPU 10. As described above, the diagnostic programs 32a, 32b, 32c, . . . are loaded in the order from the basic functions to the applicable functions of the CPU 10. Thus, a defective function is gradually identified from the functions of the CPU 10, and therefore, it is possible to identify in detail up to which grade of functions can be performed in the functions of the CPU 10.

Now, referring to FIG. 6, the CPU-diagnostic process performed by the computer apparatus 1 according to the embodiment is explained. FIG. 6 is a flowchart of the CPU-diagnostic process performed by the computer apparatus 1. The CPU-diagnostic process in FIG. 6 is performed, after the computer apparatus 1 is turned on, by the diagnostic CPU 11 reading the BIOS program 31 from the ROM 30 and executing it.

As illustrated in FIG. 6, first, the memory-diagnostic unit 311 of the BIOS program 31 executes the memory-diagnostic program 33 (step S11). The memory-diagnostic unit 311 diagnoses the entire areas of the DRAM 20 area by area (step S12). At this time, the memory-diagnostic unit 311 associates the memory-diagnostic result with address information of the DRAM 20.

Then the memory-diagnostic unit 311 then determines whether there is any undiagnosed area in the entire areas of the DRAM 20 (step S13). This determination is made by determining whether the memory-diagnostic result is associated with address information of each area of the DRAM 20. If determining that there is an undiagnosed area in the entire areas of the DRAM 20 (Yes at step S13), the memory-diagnostic unit 311 repeats the processes of step S12 and step S13 until no undiagnosed area is present in the entire areas of the DRAM 20.

Meanwhile, if determining that there is no undiagnosed area in the entire areas of the DRAM 20 (No at step S13), the memory-diagnostic unit 311 refers to the address information of the DRAM 20 diagnosed as abnormal, and then identifies a defective area in the DRAM 20 (step S14).

The diagnostic-program loading unit 312 sets the areas of the DRAM 20 other than the defective area identified at step S14 as the load area (step S15). Then, the diagnostic-program loading unit 312 loads, into the load area, one of the diagnostic-programs in the CPU-diagnostic program 32 (step S16).

Subsequently, by executing the loaded CPU-diagnostic program 32, the defective-function identifying unit 313 identifies a defective function from the functions of the CPU 10 (step S17). Then, the defective-function identifying unit 313 sends the identified defective function of the CPU 10 to the diagnostic-result notifying unit 315 as the diagnostic result of the CPU 10.

The defective-function identifying unit 313 determines whether a defective function of the CPU 10 is identified at step S17 (step S18). If determining that there is a defective function of the CPU 10 (Yes at step S18), the defective-function identifying unit 313 sends the identified defective function of the CPU 10 to the diagnostic-result notifying unit 315 as the diagnostic result of the CPU 10. The diagnostic-result notifying unit 315 displays the diagnostic result of the CPU 10 received from the defective-function identifying unit 313 on the display 50 via the display controller 40 (step S22), and the CPU-diagnostic process ends.

Meanwhile, if determining that there is no defective function of the CPU 10 (No at step S18), the defective-function identifying unit 313 determines whether all the programs in the CPU-diagnostic program 32 are executed (step S19). If the defective-function identifier 313 determines that not all the programs in the CPU-diagnostic program 32 are executed (No at step S19), the process returns to step S16. Meanwhile, if the defective-function identifying unit 313 determines that all the programs in the CPU-diagnostic program 32 are executed (Yes at step S19), the process proceeds to step S20.

At step S20, the BIOS program 31 starts up the OS, and the process proceeds to step S21.

At step S21, the OS-abnormality detector 314 of the BIOS program 31 detects whether there is the start-up abnormality of the OS. If the OS-abnormality detector 314 detects the start-up abnormality of the OS (Yes at step S21), the OS-abnormality detector 314 sends a detection signal to the diagnostic-result notifying unit 315. Upon receiving the detection signal from the OS-abnormality detector 314, the diagnostic-result notifying unit 315 displays the diagnostic result of the CPU 10 received from the defective-function identifying unit 313 on the display 50 via the display controller 40 (step S22), and the CPU-diagnostic process ends. Meanwhile, if the OS-abnormality detector 314 detects that there is no start-up abnormality of the OS (No at step S21), the CPU-diagnostic process ends.

As described above, according to the embodiment, by diagnosing the DRAM 20, the memory-diagnostic unit 311 identifies a defective area in the DRAM 20. The diagnostic-program loading unit 312 loads the CPU-diagnostic program 32 into areas of the DRAM 20 other than the defective area. The defective-function identifying unit 313 executes the loaded CPU-diagnostic program 32 to identify a defective function, which cannot be performed or is disabled, from among the functions of the CPU 10. With the above configuration, the defective function of the processor is reliably identified, and the proper conduction of the various diagnostic tests are ensured.

While a specific embodiment has been described, other embodiments or modifications are also possible. In the following, such modifications are described.

In the embodiment described above, the diagnostic-program loading unit 312 and the defective-function identifying unit 313 are described as functional units which are realized by the diagnostic CPU 11 executing the BIOS program 31 stored in the ROM 30. This is by way of example and not of limitation. For example, the functions of the diagnostic-program loading unit 312 and the defective-function identifying unit 313 may be shared by the CPU 10 and the diagnostic CPU 11.

In this case, a processor-switching unit that switches the diagnostic CPU 11 to the CPU 10 is provided to the BIOS program 31. Specifically, when the diagnostic-program loading unit 312 loads the diagnostic programs 32a, 32b, 32c, . . . up to a predetermined order, and when the defective-function identifying unit 313 executes the loaded diagnostic programs, the processor-switching unit switches the diagnostic CPU 11 to the CPU 10. Thus, among the programs in the CPU-diagnostic program 32, the diagnostic programs whose order is later than the predetermined order are executed by the CPU 10 in place of the diagnostic CPU 11.

Thus, if the processor-switching unit is provided to the BIOS program 31, among the functions of the CPU 10, diagnosis of the basic functions may be executed by the diagnostic CPU 11, and diagnosis of the applicable functions may be executed by the CPU 10 itself. As a result, the processing load of the diagnostic CPU 11 can be reduced, and the processing time of the overall CPU-diagnostic process can be shortened. Moreover, as the diagnostic CPU 11, a low-performance and low-cost processor may be used, and then an increase of the overall production cost of the computer apparatus 1 can be suppressed.

The components of the computer apparatus, or an arbitrary combination of the components or expressions described above may be applied to a method, apparatus, system, computer program, storage medium, data structure, and the like to achieve the same effect.

In the embodiment, although the CPU-diagnostic process is performed by executing the BIOS program 31 on the DRAM 20, the BIOS program 31 may be executed on a cash memory inside the CPU.

The BIOS program 31, the CPU-diagnostic program 32, and the memory-diagnostic program 33 of the embodiment need not necessarily be stored in the ROM 30. For example, the BIOS program 31, the CPU-diagnostic program 32, and the memory-diagnostic program 33 may be stored in a rewritable nonvolatile memory such as a flash memory so that the diagnostic CPU 11 can read the programs from the memory and execute them.

The BIOS program 31, the CPU-diagnostic program 32, and the memory-diagnostic program 33 of the embodiment, for example, may also be downloaded to a flash memory from a server or the like connected via a network. Further, the BIOS program 31, the CPU-diagnostic program 32, and the memory-diagnostic program 33 may be stored in a storage medium such as CD-ROM, and loaded into a flash memory via the drive of the storage medium.

As set forth hereinabove, according to an embodiment, the defective function of a processor can be reliably identified, and thereby proper conduction of various diagnostic tests can be ensured.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer apparatus comprising:
a first processor;
a second processor;
a main memory;
a memory-diagnostic unit that causes the second processor to execute a memory-diagnostic program to diagnose the main memory, and identifies a defective area in the main memory;
a diagnostic-program loading unit that loads a processor-diagnostic program for diagnosing a plurality of functions of the first processor into an area of the main memory other than the defective area identified by the memory-diagnostic unit;
a defective-function identifying unit that causes the second processor to execute the processor-diagnostic program loaded by the diagnostic-program loading unit, and identifies a defective function that is disabled from the functions of the first processor; and
a processor-switching unit that switches the second processor to the first processor, wherein
the processor-diagnostic program includes a plurality of diagnostic programs that diagnose the plurality of functions of the first processor, respectively,
the diagnostic-program loading unit sequentially loads the plurality of diagnostic programs in an order of a diagnostic program diagnosing a basic function among the functions of the first processor to a diagnostic program diagnosing an applicable function among the functions of the first processor,
the processor-switching unit switches, when the diagnostic-program loading unit loads the plurality of diagnostic programs up to a predetermined order of the order and the defective-function identifying unit causes the second processor to execute the processor-diagnostic programs loaded by the diagnostic-program loading unit, the second processor to the first processor, and
the diagnostic programs whose order is later than the predetermined order among the plurality of diagnostic programs are executed by the first processor switched by the processor-switching unit.

2. The computer apparatus according to claim 1, wherein the defective-function identifying unit causes the second processor to sequentially execute the diagnostic programs sequentially loaded by the diagnostic-program loading unit, and gradually identifies the defective function.

3. The computer apparatus according to claim 1, further comprising:
an operating-system-abnormality detector that detects start-up abnormality of an operating system that is started up in the computer apparatus; and
a diagnostic-result notifying unit that notifies, when the operating-system-abnormality detector detects start-up abnormality of the operating system, the defective function identified by the defective-function identifying unit as a diagnostic result of the first processor.

4. The computer apparatus according to claim 1, wherein the memory-diagnostic unit, the diagnostic-program loading unit, and the defective-function identifying unit start up when the computer apparatus is turned on, and are installed in a basic input and output program that controls data input and output to and from the main memory, and are placed in operation when the basic input and output program starts up.

5. A processor diagnostic method applied to a computer apparatus including a first processor, a second processor, and a main memory, the processor diagnostic method comprising:
a memory-diagnostic unit causing the second processor to execute a memory-diagnostic program to diagnose the main memory, and identifying a defective area in the main memory;
a diagnostic-program loading unit loading a processor-diagnostic program for diagnosing a plurality of functions of the first processor into an area of the main memory other than the defective area identified by the memory-diagnostic unit;
a defective-function identifying unit causing the second processor to execute the processor-diagnostic program loaded by the diagnostic-program loading unit, and identifying a defective function that is disabled from the functions of the first processor; and
a processor-switching unit switching the second processor to the first processor, wherein
the processor-diagnostic program includes a plurality of diagnostic programs that diagnose the plurality of functions of the first processor, respectively,
the loading includes sequentially loading the plurality of diagnostic programs in an order of a diagnostic program diagnosing a basic function among the functions of the first processor to a diagnostic program diagnosing an applicable function among the functions of the first processor,
the switching includes switching, when the loading loads the plurality of diagnostic programs up to a predetermined order of the order and the causing causes the second processor to execute the processor-diagnostic programs loaded at the loading, the second processor to the first processor, and
the diagnostic programs whose order is later than the predetermined order among the plurality of diagnostic programs are executed by the first processor switched at the switching.

6. A non-transitory computer readable storage medium containing instructions that, when executed by a computer, causes the computer including a first processor, a second processor, and a main memory to perform:
causing the second processor to execute a memory-diagnostic program to diagnose the main memory, and identifying a defective area in the main memory;
loading a processor-diagnostic program for diagnosing a plurality of functions of the first processor into an area of the main memory other than the defective area;
causing the second processor to execute the processor-diagnostic program loaded at the loading, and identifying a defective function that is disabled from the functions of the first processor; and
switching the second processor to the first processor, wherein
the processor-diagnostic program includes a plurality of diagnostic programs that diagnose the plurality of functions of the first processor, respectively,
the loading includes sequentially loading the plurality of diagnostic programs in an order of a diagnostic program diagnosing a basic function among the functions of the first processor to a diagnostic program diagnosing an applicable function among the functions of the first processor,
the switching includes switching, when the loading loads the plurality of diagnostic programs up to a predetermined order of the order and the causing causes the second processor to execute the processor-diagnostic programs loaded at the loading, the second processor to the first processor, and
the diagnostic programs whose order is later than the predetermined order among the plurality of diagnostic programs are executed by the first processor switched at the switching.

* * * * *